(12) United States Patent
Lui

(10) Patent No.: US 6,624,635 B1
(45) Date of Patent: Sep. 23, 2003

(54) UNINTERRUPTABLE POWER SUPPLY

(75) Inventor: Albert S. Lui, Cupertino, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/425,870

(22) Filed: Oct. 23, 1999

(51) Int. Cl.[7] .................... G01N 27/416; H04M 1/00
(52) U.S. Cl. .............. 324/426; 379/413; 340/636.19
(58) Field of Search .......................... 379/413, 413.01, 379/413.02, 413.04; 324/426, 427, 428, 429, 430, 433; 340/636.1, 636.11, 636.12, 636.19; 320/127, 128, 129, 131, 132, 134

(56) References Cited

U.S. PATENT DOCUMENTS

| | | | |
|---|---|---|---|
| 4,180,770 A | | 12/1979 | Elby |
| 4,316,185 A | | 2/1982 | Watrous et al. |
| 4,333,149 A | * | 6/1982 | Taylor et al. ............. 364/481 |
| 4,423,378 A | * | 12/1983 | Marino et al. ............ 324/427 |
| 4,521,735 A | | 6/1985 | Kageyama et al. |
| 4,673,826 A | * | 6/1987 | Masson ................... 364/494 |
| 5,047,961 A | | 9/1991 | Simonsen |
| 5,061,898 A | * | 10/1991 | Oram et al. .............. 324/427 |
| 5,122,751 A | | 6/1992 | Aita et al. |
| 5,126,585 A | | 6/1992 | Boys |
| 5,281,955 A | * | 1/1994 | Reich et al. ............. 340/636 |
| 5,438,270 A | | 8/1995 | Harper et al. |
| 5,454,710 A | | 10/1995 | Landau et al. |
| 5,473,262 A | | 12/1995 | Yoshimatsu |
| 5,528,149 A | | 6/1996 | Chen |
| 5,570,025 A | | 10/1996 | Lauritsen |
| 5,583,440 A | * | 12/1996 | Bisher .................... 324/426 |
| 5,610,525 A | | 3/1997 | Yoshida et al. |
| 5,650,712 A | | 7/1997 | Kawai et al. |
| 5,672,973 A | | 9/1997 | Arai et al. |
| 5,705,929 A | | 1/1998 | Caravello et al. |
| 5,726,573 A | | 3/1998 | Chen et al. |
| 5,744,962 A | * | 4/1998 | Alber et al. .............. 324/426 |
| 5,798,646 A | | 8/1998 | Arai |
| 5,886,503 A | | 3/1999 | McAndrews et al. |
| 5,939,990 A | | 8/1999 | Ahn |
| 6,031,354 A | * | 2/2000 | Wiley et al. ............. 320/116 |

* cited by examiner

Primary Examiner—Rexford Barnie
(74) Attorney, Agent, or Firm—Jay A. Chesavage

(57) ABSTRACT

An uninterruptable power supply for use with an Internet Telephone or Internet Telephone Cable Modem comprises a power supply and a load. The power supply has an AC/DC converter for producing converter DC, and also a rechargeable battery. A DC output multiplexer selects one of such DC sources and furnishes it to the load. The multiplexer has an input control signal for switching the DC source to a battery, and an output indicator indicating when the battery is acting as the DC source. The load includes a controller which generates this test signal at times when it is useful to test the battery, and accepts the indicator signal to know when the battery is providing this current. The controller includes a test function for measuring the reserve charge of the battery by measuring the temporal voltage drop and time of this temporal voltage drop with the use of an A/D converter. Additionally, the controller measures the charge and discharge intervals of the battery. The controller includes NVRAM which stores the test state, and an internet connection for the passage of messages to and from the internet.

27 Claims, 7 Drawing Sheets

Prior Art: UPS Design

Battery Test Circuit
Prior Art

UPS for Internet Telephone

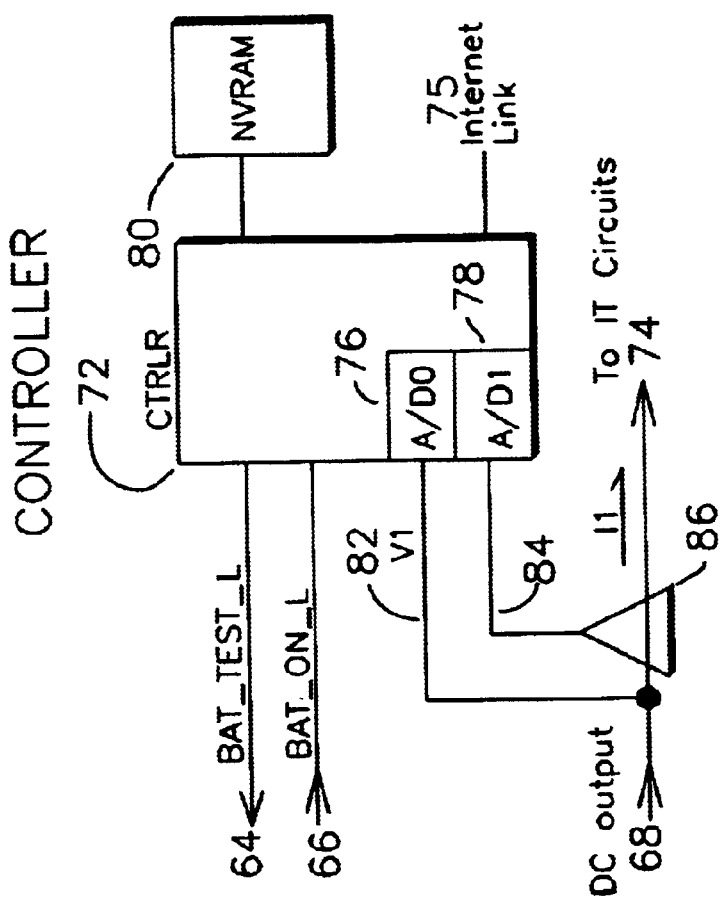
Figure 4b: CONTROLLER
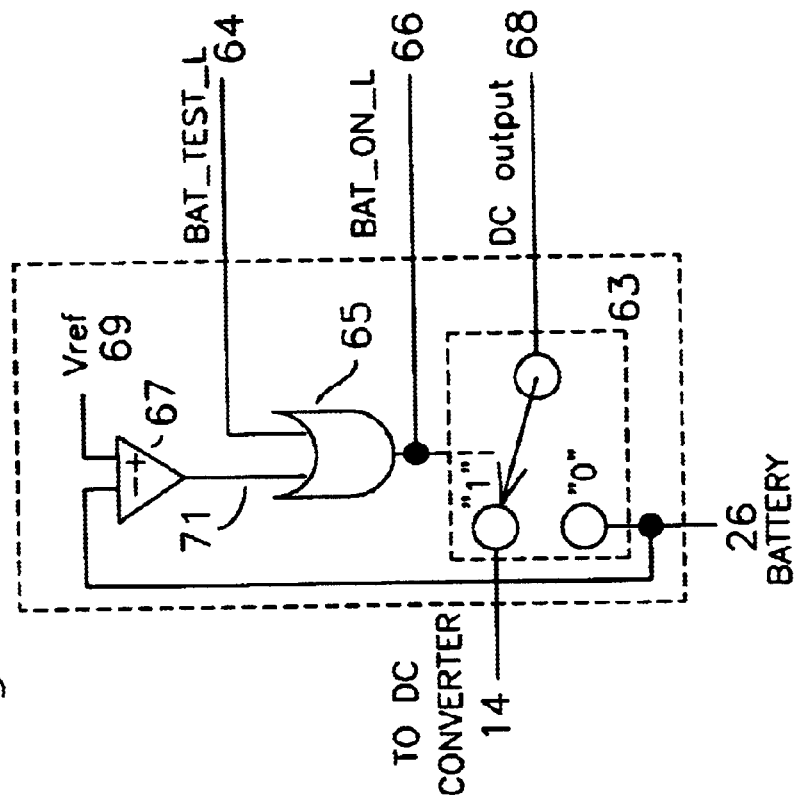
Figure 4a: MULTIPLEXER

Charge Estimation Waveforms

Reserve Capacity vs Td and Vd

| Reserve Capacity | Vd=V2−V3 | Td=T2−T1 |
|---|---|---|
| 100% | 3.04V | 11ms |
| 90% | 3.6V | 13ms |
| 80% | 3.8V | 14.4ms |
| 70% | 4V | 14.72ms |
| 60% | 4V | 15ms |

Reserve Capacity vs Number of Discharges

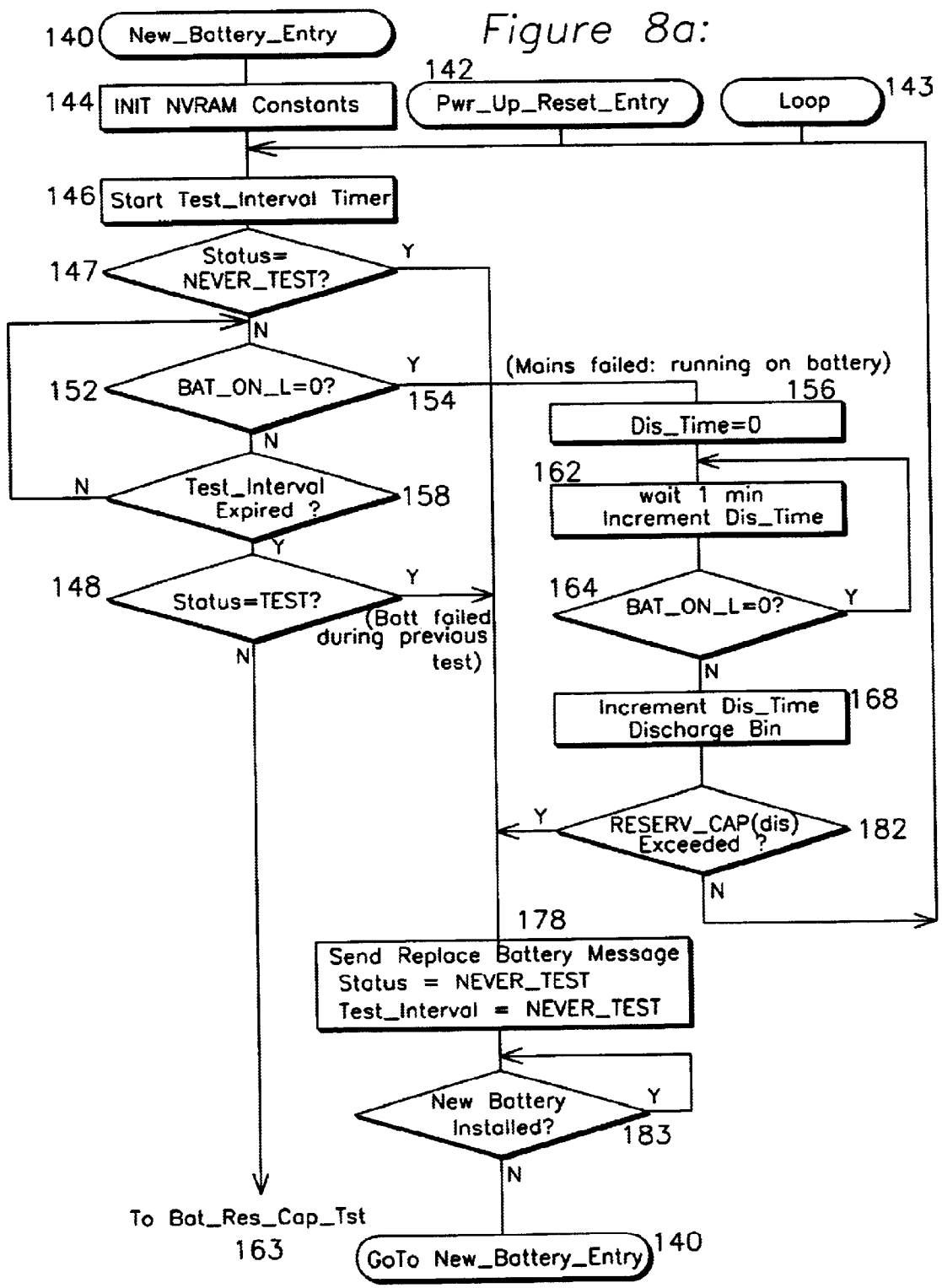

UNINTERRUPTABLE POWER SUPPLY

FIELD OF THE INVENTION

This invention relates to Uninterruptable Power Supplies (UPS), and more specifically, to the class of UPS used to provide power to an Internet Telephone (IT), an Internet Telephone Cable Modem (ITCM), and an Internet Telephone xDSL Modem (ITDM).

BACKGROUND OF THE INVENTION

This invention is in the field of power sources which power a load such as an internet telephone, wherein the power source includes both an internal source such as a rechargeable battery, and an external source such as mains voltage. In an internet telephone, power is usually furnished to the telephone through the mains. However, during power outages, it is critical that the telephone operate reliably using the internal source. Moreover, since mains power failures are infrequent, it is very important that the reserve capacity of the internal source be known in advance of switching over to this source during a time of power outage. It is also important to advise the user to replace the battery when it demonstrates insufficient reserve capacity, rather than make this determination when there is no alternative power source available.

It is desired to periodically measure the reserve capacity of the battery as accurately as possible to ascertain that it is capable of operating the internet telephone in the event of mains power failure and to make such measurement when it is unlikely to interfere with a users utilization of the internet telephone.

There are several prior art techniques used to estimate the reserve charge in a battery. One class of system utilizes the open circuit voltage of the battery in comparison to the loaded voltage of the battery. One such example system is U.S. Pat. No. 4,180,770 by Eby. In this system, the difference between open circuit voltage and loaded voltage of the battery actuates a comparator which drives an indicator. Quite often, this load comprises a test load independent of the actual load, such that the test load provides for an accurate measurement. Another example system is described in U.S. Pat. No. 5,122,751 by Aita et al. In this patent, the test load comprises the actual device receiving power, and the reserve charge is determined by comparing the discharge curve for the present battery driving this actual load against a series of characteristic battery curves shown in FIG. 6 of this reference. When a match is made based on discharge characteristic, a depth of discharge is imputed to the battery. U.S. Pat. No. 5,650,712 by Kawai et al describes an algorithm whereby a circuit external to the battery monitors the charge added or subtracted from the battery, and stores this estimate in a memory. The reserve capacity is therefore indicated in this memory. U.S. Pat. No. 5,726,573 by Chen discloses an external power supply charging a battery. From time to time, a CPU requests a test of the battery, which only occurs when the battery has sufficient voltage. If the battery drops below a specified voltage during the test, a signal is sent to the CPU indicating this failure, and further tests are prevented until the battery is replaced.

SUMMARY OF THE INVENTION

The present invention comprises an AC/DC converter, a rechargeable battery, a device load typically comprising an internet telephone, a controller producing a BAT_TEST_L signal, and a multiplexer controlled by this BAT_TEST_L signal, whereby the internet telephone is either powered by the battery, or it is powered by the AC/DC converter through the external AC mains. Additionally, there is a battery charging circuit, whereby the battery is charged by the AC/DC converter while the converter is powering the internet telephone. When external mains power source is present, the converter provides a trickle charge to the battery, typically at a rate which would require 24 hours to fully charge the battery from a discharged initial state. During the duration of trickle charge, the battery reaches a fully charged state. When the controller determines that it is time to test the reserve capacity of the battery, it asserts a BAT_TEST_L signal, which causes the multiplexer to change the power source to the battery. During this time, the battery charging circuit is disabled. For the duration of measurement, the battery is furnishing current to the internet telephone, which acts as a live test load, and the output voltage and current of the battery are measured. After the measurement interval has ended, the controller deasserts the BAT_TEST_L signal, and the internet telephone is again powered by the converter through the external AC mains. From the acquired data during the measurement interval, a discharge time Td and a discharge voltage Vd is extracted. The Td and Vd values are compared to an exemplar set of values stored in the controller, and a value for reserve capacity is determined. This reserve capacity value is stored in the non-volatile random access memory (NVRAM) of the controller. The example set of values related to the reserve capacity of the battery is pre-determined at the factory, and a minimum reserve capacity value can be chosen for a particular class of battery. If the value of reserve capacity measured during the battery test falls below a minimum reserve capacity value, a message is sent to the user requesting replacement of the battery. The time that the charge estimation test is initiated and the interval between such tests is varied according to the known state of the battery and the usage pattern of the telephone. Tests are always initiated during times of minimum use, based on usage patterns measured by the network to which the IT is attached. The frequency of the battery reserve capacity test is varied according to the state of the battery. For example, a new battery is tested less frequently than a battery with a diminishing reserve capacity margin over acceptable thresholds.

In addition to the measurement of Td and Vd values, each time the battery is discharged by the IT during a mains power fail condition, a record is kept in the non-volatile memory (NVRAM) of the controller of the number of discharges and depth of each discharge. Since the battery life may also be estimated by the depth of discharge and the number of such discharges, it is also possible to estimate the life of the battery based on these discharge records. When the threshold for discharges at various depths is exceeded, a message is sent to replace the battery.

The reserve capacity threshold and the discharge depth and discharge cycle threshold of the battery can be updated after the internet telephone has been installed in the field, through the network connection between the internet telephone and the Service Provider (the Central Office). This capability to revise the various threshold values after installation allows the Service Provider to obtain the maximum usage from a battery. Additionally, the discharge record and the current reserve capacity of the battery can also be retrieved by the Service Provider periodically. This capability allows the Service Provider to plan replacement battery procurement in an orderly fashion.

OBJECTS OF THE INVENTION

A first object of the invention is to enable the measurement of reserve capacity of a battery using the most accurate load possible. A second object of the invention is to vary the interval between tests according to measured parameters and the current internet telephone operating state, in order not to interrupt the normal operations of the internet telephone. A third object of the invention is to disable reserve capacity measurement when an excessively low reserve capacity measurement has been made, or it has been detected that the previous reserve capacity measurement test failed to complete. A fourth object of the invention is to allow the alteration of battery replacement criteria after the UPS has been deployed through network updates to gain maximum useful life from the battery, and to allow the monitoring of reserve capacity of all batteries deployed in the field.

DESCRIPTION OF THE DRAWINGS

FIG. 4a is the block diagram for the multiplexer of FIG. 3.

FIG. 4b is the block diagram for the controller of FIG. 3.

FIGS. 8a and 8b show a flowchart for the reserve charge measurement and estimation functions of the controller of FIG. 4b.

DETAILED DESCRIPTION OF THE INVENTION

Figure 1:
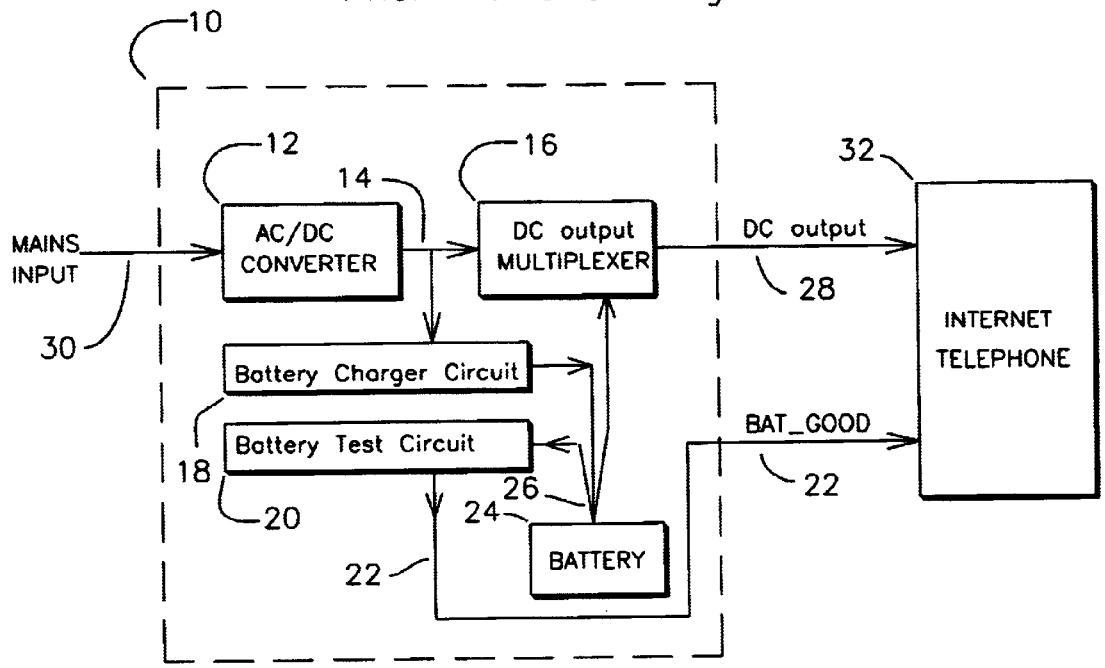
FIG. 1 is the block diagram for a prior art Uninterruptable Power Supply (UPS) providing power to an Internet Telephone (IT).

FIG. 1 shows a prior art UPS comprising a power supply 10 and an Internet Telephone 32, which is understood to be any load requiring power from a battery during times of mains power 30 interruption. Mains power 30 is delivered to an AC to DC converter 12, which produces a DC output 14. This output is used to power a battery charger circuit 18, which furnishes charge to battery 24 via terminal 26. The battery provides charge to DC output multiplexer 16, which selects between DC source 14, or battery 26. As one example, multiplexer 16 could comprise a first diode having an anode connected to converter 14 and a cathode connected to DC output 28, and a second diode having an anode connected to the battery 26, and cathode connected to DC output 28. With these connections, battery voltage 26 must be greater than the DC output 14 before current flows out of the battery 24 to DC output 28. During this time, the battery may be charged by charge circuit 18, which may simply comprise a resistor connected between output 14 and battery terminal 26. The reserve capacity of the battery is determined by test circuit 20, which produces the signal BAT_GOOD 22, indicating to the internet telephone whether the battery has a sufficient level of reserve charge. The negative assertion of the BAT_GOOD signal is commonly used to illuminate an indicator on the internet telephone when it is time to replace the battery.

Figure 2:
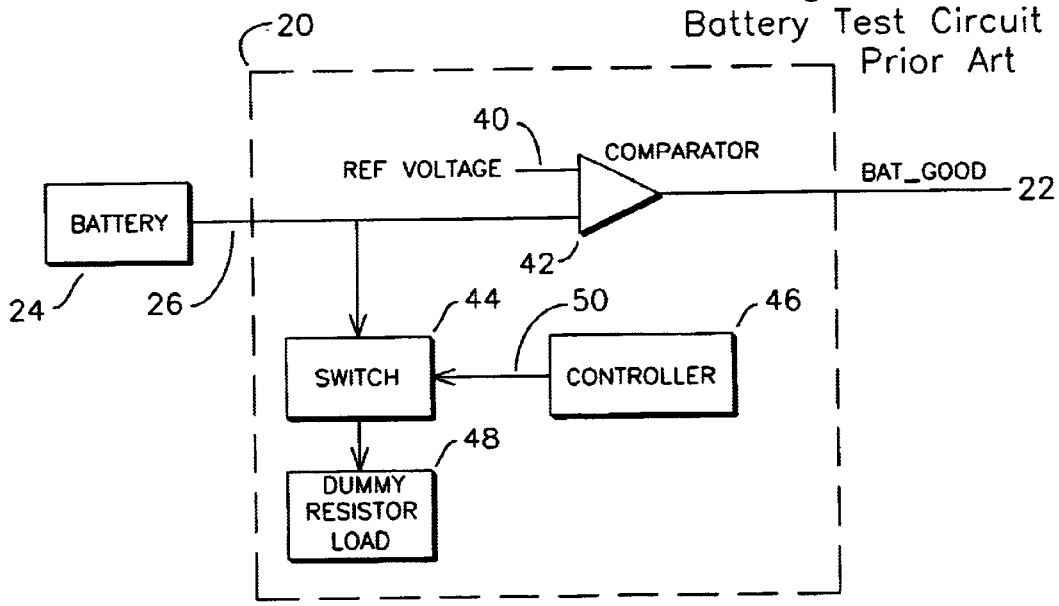
FIG. 2 is the block diagram for a prior art battery test circuit for the UPS of FIG. 1.

FIG. 2 shows an example battery test circuit 20. The battery 24 provides a battery voltage 26, which periodically is connected to dummy resistor load 48 using switch 44. The switch enables the connection of the battery 24 to the dummy load 48 upon the assertion of test signal 50 produced by controller 46. During the time of test, the battery voltage 26 is compared to a reference voltage 40 by comparator 42. If the battery voltage 26 exceeds this reference voltage 40 during the brief test time, the BAT_GOOD signal 22 is asserted.

Figure 3:
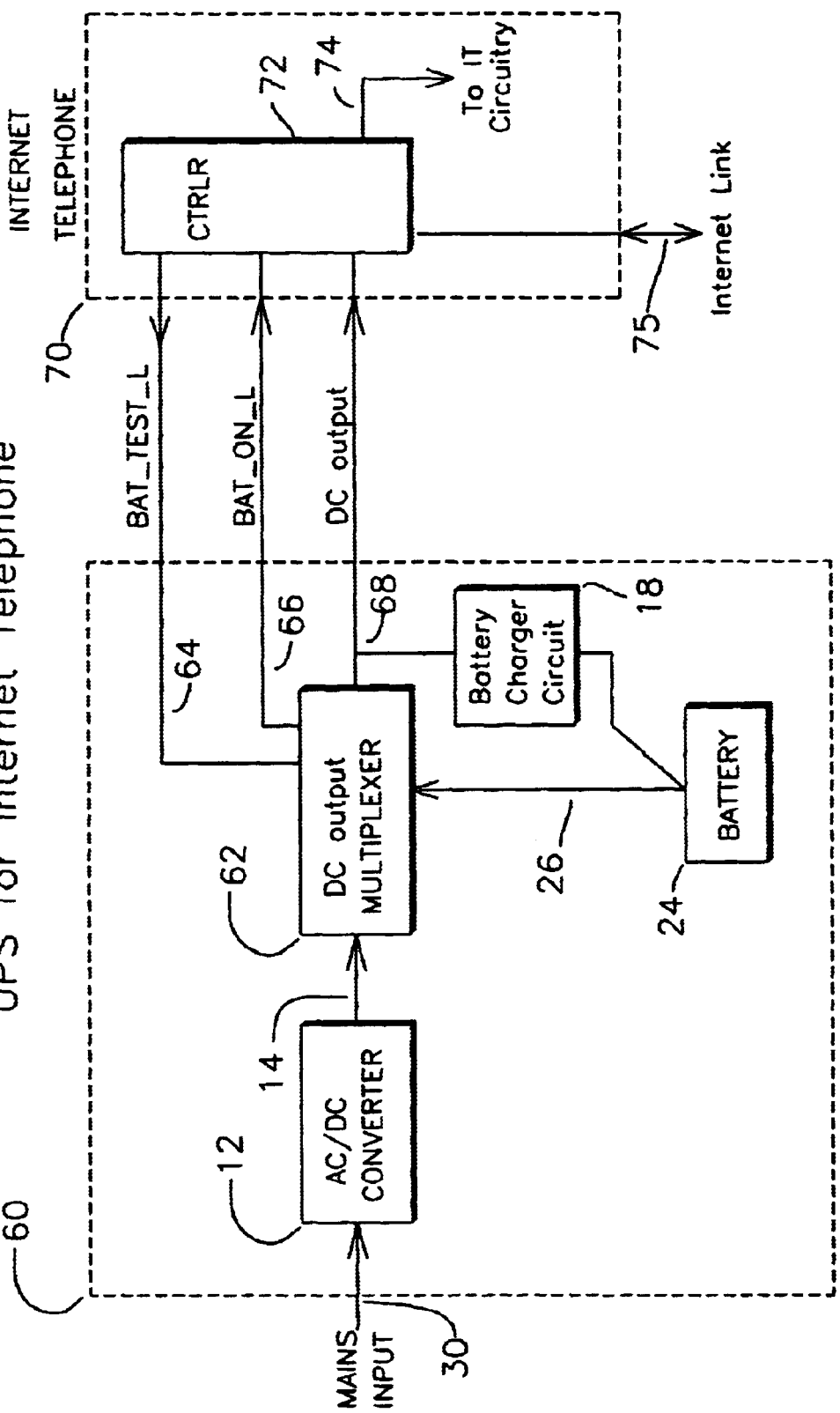
FIG. 3 is the block diagram for an Uninterruptable Power Supply for an Internet Telephone.

FIG. 3 shows an uninterruptable power supply 60 connected to an internet telephone 70. The internet telephone 70 has a controller 72, which receives a DC output 68 from the power supply 60 before passing it to the remaining circuits via terminal 74, and also generates a BAT_TEST_L signal 64, and receives a BAT_ON_L signal 66. Additionally, the controller 72 includes an internet link 75, which may include any physical layer format which directly or indirectly provides for the transmission and reception of internet messages. These messages may be in the Internet Protocol (IP), or any other protocol which affords the transmission of a "replace battery", or reception of a "test battery" message. The uninterruptable power supply 60 includes mains input 30, and an AC to DC converter 12 producing a dc output 14, as before. Battery 24 has an output 26, which is delivered to DC output multiplexer 62. The multiplexer 62 is controlled by BAT_TEST_L input 64, and connects the battery 24 to the DC output 68 when BAT_TEST_L 64 is asserted. During the time BAT_TEST_L 64 is asserted, the DC output 68 is provided exclusively by the battery 24, and when it is not asserted, the DC output 68 is provided by the AC/DC converter output 14. BAT_ON_L 66 is generated by the multiplexer 62 to indicate that the battery 24 is actively providing charge. The multiplexer 62 includes a provision which prevents the switchover to the battery 24 if the battery voltage 26 fails to maintain a minimum level. When the multiplexer 62 blocks this switchover due to a defective or marginal battery 24, or a switchover occurs before the completion of the test, BAT_TEST_L 64 is not asserted, or it stops being asserted upon cessation of the battery providing current to the load. Battery charger circuit 18 typically comprises a diode in series with a resistor, such that current flows to the battery when converter 12 is producing an output in excess of the battery voltage.

FIG. 4a shows the details of a multiplexer 62. Converter voltage 14 enters one input of switch 63. Battery voltage 26 enters the other input of switch 63, and DC output exits on terminal 68. The battery voltage is compared to a reference voltage 69 by comparator 67, which produces a "0" at comparator output 71 when the voltage level is sufficient. Upon assertion of BAT_TEST_L 64 to a "0" level, the OR gate 65 produces a 0 output at BAT_ON_L 66, and switch 63 selects the battery 26 as a source. The battery continues to supply current to the telephone load until either the test is terminated through the deassertion of BAT_ON_L 66, or the battery voltage 26 falling below the VREF 69. In either event, the switch changes over to the converter DC 14. It is understood by one skilled in the art that there are many such multiplexer and battery test circuits that could be used to perform this function. The example circuit shown illustrates the operation of the invention and is not intended to limit the practice of the invention to the particular embodiment shown. The function of the battery test of the multiplexer 62 is to perform a very simple and crude test which terminates the test in the event the battery fails during or before the more accurate measurement described later.

FIG. 4b shows the internet telephone controller 72 in additional detail. The DC output 68 passes through a current measurement device 86 before powering all of the internet telephone circuits, which are connected to IT circuit node 74. The measurement device 86 produces a current measurement output 84, which is sampled along with the DC output voltage 82. During the time that BAT_TEST_L 64 is asserted, DC output 68 is identical to battery voltage 26. Both the voltage 82 and current 84 are sampled by A/D converters 76 and 78 in the controller 72. BAT_ON_L signal 66 is not asserted by the multiplexer 62 when the battery 24 is not fully charged, or is in a depleted charge condition, as described earlier. This prevents a failure caused by switching over to a depleted or defective battery 24 when BAT_TEST_L 64 is asserted. In this manner, the controller may determine that the battery is depleted or unavailable when BAT_ON_L 66 is not asserted shortly after BAT_TEST_L 64 is asserted, and the test may be terminated. NVRAM 80 is used for the permanent storage of battery characteristics, as well as data taken from A/D converters 76 and 78. Internet link 75 is for the transmission and reception of network messages, as described earlier, and may also be used for the transmission and reception of battery characteristics, controller program code, and the like.

Figures 5, 6:
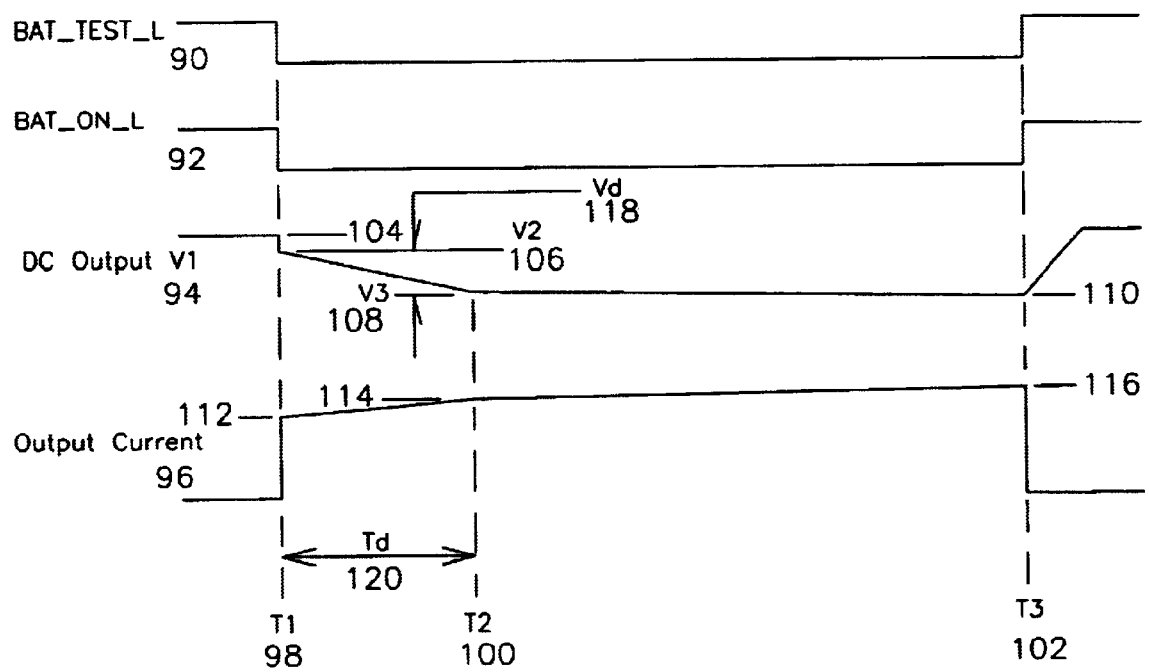
FIG. 5 shows the waveforms for the charge estimation test.
FIG. 6 shows the relationship between reserve capacity, Td and Vd.

FIG. 5 shows the measurement waveforms of the present invention of FIG. 3. BAT_TEST_L 64 is asserted at time T1 98, as shown in waveform 90. If the multiplexer determines that the battery has enough charge or voltage to participate in the measurement, BAT_ON_L 66 is asserted, as shown in waveform 92. When the trickle charge is removed by charger circuit 18, the DC output of the battery 94 moves from the charging voltage 104 to the pre-discharge voltage V2 106. During this time, the internet telephone 70 is the load device, which is shown drawing an output current 96 at the level shown as 112. For a discharge time $T_d$ 120 from T1 98 to T2 100, the DC output falls fairly linearly from time T1 98 until time T2 100. Thereafter, the rate of voltage drop per unit time is much smaller, and represents the typical discharge characteristic of a rechargeable battery, until time T3, when the test is terminated by deasserting BAT_TEST_L 90, causing the deassertion of BAT_ON_L 92. The proper measurement of Td 120 formed by the difference between T2 and T3, and Vd 118 formed by the difference between V2 106 and V3 108 is essential for the accurate determination of reserve capacity. Time T2 may be found by taking the first derivative of V1 94 with respect to time, and finding the point T2 where this derivative encounters a large change in value, as can be seen from the change in slope at T2 in FIG. 5. Therefore, one measurement of T2 would be point in time where the first derivative of V1 94 with respect to time changes to ½ or less of its former value.

FIG. 6 shows the measured reserve capacity of a battery versus Vd and Td. In this example, the known characteristics of battery model number HC1221W manufactured by CSB Battery Technology of San Diego, Calif. are shown, and if a measurement of Vd were 3.8V, or if Td was 14 ms, it could be determined that the battery had a reserve capacity of 80%.

Figure 7:
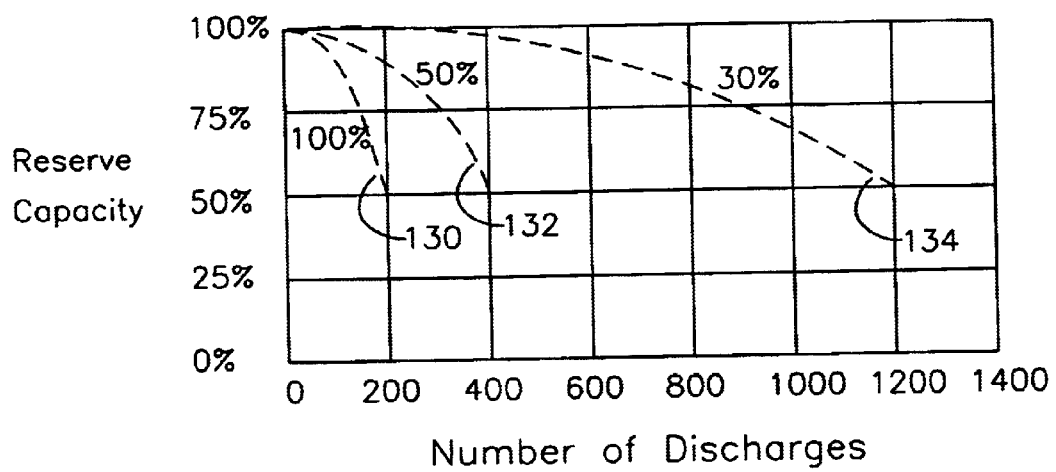
FIG. 7 shows the relationship between reserve capacity and number of discharges.

FIG. 7 shows the battery manufacturer's published graphs of reserve capacity versus number of discharge cycles and the depth of discharge referenced to a full charge. For example, curve 130 shows that after 200 cycles of 100% discharge, the reserve capacity of a fully charged battery would be 50% of a new fully charged battery. If 1200 discharge cycles of 30% of full discharge were applied, curve 134 would indicate 50% reduction in reserve capacity. These values are used as examples for understanding the curves of FIG. 7. Generally, the criteria for battery replacement in mission-critical systems such as IT equipment is 70%–80% of reserve capacity.

Figure 8B:
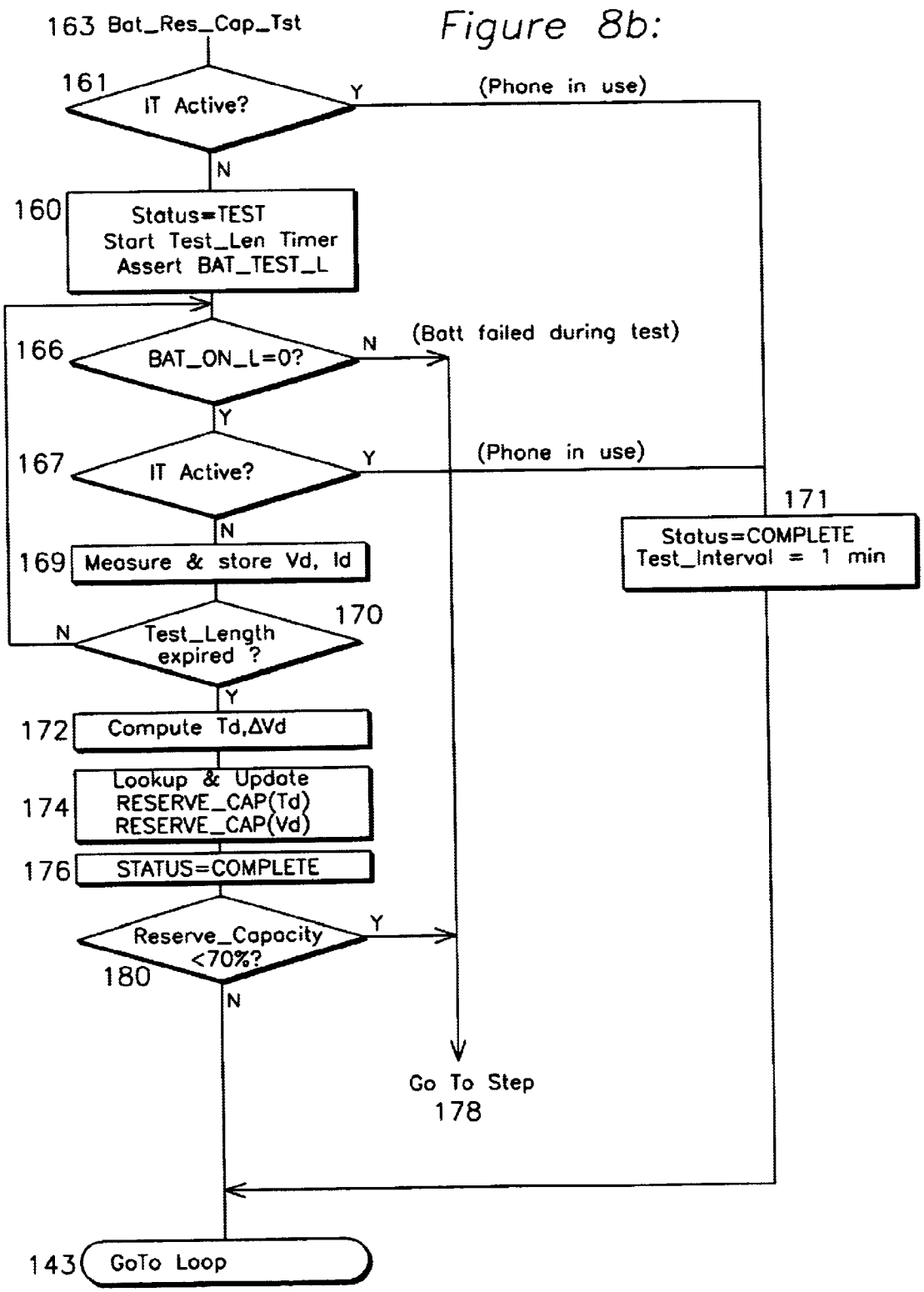

FIGS. 8a and 8b show the flowchart used by the controller 70 for determining the reserve charge of battery 24. For clarity in understanding the operation of the program, upper case letters are used to indicate a fixed value or signal name, such as the value NEVER_TEST, or the signal BAT_TEST_L. Mixed upper and lower case are used to indicate variables, such as Status or Dis_Time. When a new battery is installed in the unit, the program is entered at New_Battery_Entry 140. At the time of New_Battery_Entry, an exemplar set of values related to the reserve capacity of the battery, the battery life characteristics as determined by the depth of discharge and the number of such discharges, as well as the reserve capacity threshold and the discharge depth and discharge cycle threshold to determine a bad battery are entered in the NVRAM. These values may be initialized from information stored locally, or they may be loaded from the internet link 75 described earlier using any of the many internet download protocols which could be used, such as TFTP. The NVRAM contents are initialized 144, including the battery usage history. This is a special initialization that only occurs when the battery is replaced, and the history of battery measurements and prior use of the old battery is discarded. All other power-up reset events are handled by Pwr_up_reset_entry 142. Upon entry from either Init NVRAM 144, Pwr_Up_Reset_Entry 142, or Loop 143, the Test_Interval timer is started in step 146. This timer is used to gate the period of battery testing. At step 147, the Status is examined to see if the value NEVER_TEST has been assigned in another part of the program, indicating the battery failed a test and should never be tested until the battery is replaced. If so, further battery testing is suspended, and a battery replacement message is sent via the internet link 75, and the value of Status and Test_Interval are both set to NEVER_TEST in step 178. The internet message may be periodically sent until the battery is replaced in step 183, and the program advances to New_Battery_Entry 140 at the top of FIG. 8a. If the status of step 147 is not NEVER_TEST, then BAT_ON_L is checked in step 152 to see if the mains power have failed. If BAT_ON_L is asserted, then the unit is currently running from battery power 154, and the battery charge test should not be performed, but the duration of battery operation should be measured. Step 156 sets variable Dis_Time=0, indicating the start of the discharge time measurement step. Each minute, Dis_Time is incremented in loop 162, until BAT_ON_L is no longer asserted, whereafter a bin associated with that particular discharge time is incremented. The number of discharge bins may be varied, but for the simple example illustrated in FIG. 7, a first bin containing complete discharges would indicate the number of 100% discharges, and a second bin could indicate the number of 50% discharges, and a third bin could indicate the number of 30% discharges, and so on. Periodically, each bin is tallied in step 182 to determine if the number of discharges has reduced the reserve capacity of the battery below a given rate, and if so, the replace battery message and NEVER_TEST variables would be set in step 178. Otherwise, the tally is incremented in step 168 until the reserve capacity profile as detailed in FIG. 7 is exceeded. The reserve capacity of the battery is examined by debiting the battery life against each instance of discharge at a particular depth in step 168. For example, FIG. 7 shows that 100 discharges of 100% followed by 200 discharges of 50% would leave the battery with about 70% reserve capacity after the battery was fully charged. The finding of insufficient reserve capacity results in step 178, which sends the battery replacement message and prevents further testing, as described earlier. In step 152, if the unit is not currently operating on battery power, the Test_Interval timer is tested in step 158, which returns to step 152 if the timer is not expired, or begins the battery test by checking if Status=Test in step 148. If Status=Test at this point, the battery failed at some time during the previous test, and the program goes to the replace battery steps 178 and 183, as described earlier. The final check before performing the battery reserve capacity test is to see if the internet telephone is in use in step 161. If the phone is in use in step 161, the Status flag is set to COMPLETE, and the Test_Interval time is set to 1 minute to enable testing when the phone is no longer in use. In practice, the Test_Interval time is set to match a desired profile of testing to ensure that battery testing does not interfere with telephone use, and the network link 75 is used to communicate this information from a remote telephone server monitoring this activity and the local IT. This link 75 is typically an internet link. In the present example, 1 minute was chosen to illustrate the response of the program to telephone usage before a battery test. If the telephone continues to be in use for a long interval of time, step 171 is executed rather than the test, with the Test_Interval set to a point in the future. When the telephone is found to not be in use in step 161, the reserve charge test begins in step 160. Status is set to TEST in step 160, which enables the future detection of a catastrophic failure during a previous test. An example of such a failure would be the loss of both battery and mains power during a reserve capacity test. When the mains power returned, the telephone would initialize, and Status=TEST in step 148 would indicate that the previous test failed before completion, and Status would be set to NEVER_TEST to prevent further testing, as was described earlier. The Test_Len timer of step 160 is set to indicate how long the test should run, and the signal BAT_TEST_L is asserted, requesting that the charger furnish battery power. If BAT_ON_L is not asserted in step 166, this indicates that the battery is unable to furnish enough charge to initiate a test. This exits to the replace battery message 178 of FIG. 8*a*. Otherwise, the battery test continues with the measurement of Vd and Id by step 169, which acquires data from converters 76 and 78 at periodic intervals, until the Test_Length timer expires 170, indicating the end of the test. During the acquisition time 169, samples of V and I are taken, as was described in FIG. 5. After the Test_Length timer 170 has expired, the values of Td and Vd are extracted. As was described in FIG. 6, these values may be used to extract a Reserve_Capacity(Td), which is determined from the time of discharge, and a Reserve_Capacity(Vd), which is determined from the voltage drop value. The variable Status is set to COMPLETE in step 176, indicating that the battery test properly completed, and then the Reserve_Capacity level is determined in step 180. As was described earlier, this may rely on any of the following individually, or in combination:

Reserve_capacity(dis) calculated from number of discharges at a particular depth, as described in FIG. 7;

Reserve_capacity(Td) calculated from the time of discharge 120 as shown in FIG. 5;

Reserve_capacity(Vd) calculated from voltage drop characteristic 118 as shown in FIG. 5.

There are 5 methods disclosed for estimating Reserve_Capacity. In addition to the 3 listed above, there is also the "failed to complete test" of 148, or "failed during test" of 166, and the DIS_TIME method of FIG. 7 and step 182. Using these 5 methods together, it is unlikely that they will all trigger at exactly the same time, since they are measuring different parameters related to the desired estimated value Reserve_Capacity. Therefore, the algorithm may chose to handle each of these methods depending on the criticality of usage. The most conservative metric would be to send the "replace battery message" of 178 upon any metric indicating Recerve_Capacity below a given threshold, and the threshold may be varied for each of the methods. In the best mode of the present invention, the threshold is set to 70%, and any of the 5 methods which produces an estimated Reserve Capacity below this 70% threshold is sufficient to send the "replace battery" message over internet or network link 75. It is clear to one skilled in the art that these methods could be used in parallel in a minority or majority voting scheme whereby 2 or more methods, each with its own threshold, could be combined to require the sending of the "replace battery" message of 178. Any of these alternate methods could be used to produce the invention disclosed herein. Furthermore, while the description of FIG. 8 shows the tests being conducted in a particular order for the purpose of description, it is clear that the order and types of tests could be changed without changing the invention described herein. Similarly, FIG. 3 shows an arrangement of elements, some of which are part of a controller, and some of which are part of a power supply. This distinction is drawn only for the purposes of example, and it is clear to one skilled in the art that the elements of FIG. 3 could be rearranged in arbitrary ways, or placed in a single enclosure and still practice the present invention. Likewise, the FIGS. 4*a* and 4*b* are intended to disclose a specific multiplexer and controller, rather than suggest that these specific multiplexers and controllers must be used, as the design of alternative multiplexers and controllers is also clear to one skilled in the art.

The use of the internet link 75 is an essential part of the invention, as this link may be used to send battery replacement messages, receive battery discharge characteristics from a server or other system, send battery capacity measurements, receive information on telephone usage to set the Test_Interval dynamically based on actual usage patterns for the telephone, or to download a new algorithm for testing. Each of these may be performed in a distributed server or single-point server manner as is commonly practiced in modern internet communications, whereby the information related to the transmission and reception of information related to the operation of the internet telephone, as described in this specification, may by stored in a single or plurality of network servers. It is understood by one skilled in the art that the information stored in these servers may relate to individual telephone usage parameters, battery replacement parameters, the algorithm for testing batteries, or the entire algorithm for operation of the IT. These programs or algorithms may be executed from one or more servers, or downloaded to the IT for execution within the IT.

I claim:

1. An uninterruptable power supply (UPS) producing a DC output coupled to a load having a controller, said power supply comprising:

a mains-derived power converter having an AC input connected to a mains voltage, and a converter DC output;

a battery having a battery voltage;

a multiplexer having a battery input coupled to said battery voltage, a converter input coupled to said converter DC output, a battery test input, a battery active output, and a multiplexer output which is coupled to said battery input when said battery test input is asserted and said battery input exceeds a first voltage threshold, and said multiplexer output is coupled to said converter input at all other times, said battery active asserted when said multiplexer output is selecting said battery;

said load coupled to said multiplexer output, said load controller having a battery test output coupled to said multiplexer battery test input, and said load controller having a battery active input coupled to said multiplexer battery active output.

2. The UPS of claim 1 wherein said battery is of the rechargeable type.

3. The UPS of claim 1 wherein said battery charger circuit comprises a resistor connected between said battery and said multiplexer output.

4. The UPS of claim 1 wherein said multiplexer comprises:
   a switch having said battery input, said converter input, and said multiplexer output, said switch controlled by a select input;
   said select input and said battery active output formed by gating said battery test with a comparison result formed by comparing said battery voltage to said first voltage threshold.

5. The UPS of claim 1 wherein said load controller includes:
   said battery test output;
   said battery active input;
   non-volatile storage;
   a first A/D converter coupled to said multiplexer DC output;
   a second A/D converter coupled to a measurement of the current consumed by said load;
   an optional network link to an external network.

6. The controller of claim 1 wherein said battery test signal is BAT_TEST_L.

7. The controller of claim 1 wherein said battery active signal is BAT_ON_L.

8. The controller of claim 5 wherein said non-volatile storage includes a Status variable, said Status variable set to TEST at the beginning of a load test, and set to COMPLETE at the completion of a load test.

9. The controller of claim 8 wherein said non-volatile storage includes a Test_Interval timer, said timer set to regulate the interval between testing said battery for Reserve_Capacity.

10. The controller of claim 9 wherein said Test_Interval timer enables testing during times of minimum telephone usage according to locally stored information.

11. The controller of claim 9 wherein said controller network link is used to send usage information to an external server, said server responding to said usage information by sending information which updates said Test_Interval timer to enable testing during times of minimum telephone usage according to information sent from a network server.

12. The controller of claim 8 wherein said first A/D controller samples said battery voltage from a first point when said battery active is enabled until a second point.

13. The controller of claim 12 wherein said second point is determined by a change in the slope of said voltage samples with respect to time, where said A/D controller samples are uniformly spaced in time.

14. The controller of claim 13 wherein said second point is determined by measuring a ratio of slopes of said voltage with respect to time before said second point to the slope of said voltage with respect to time after said second point, said ratio greater than 2.

15. The controller of claim 14 wherein the reserve charge of said battery is estimated by subtracting said battery voltage from said second point from said battery voltage at said first point and comparing this result to a battery discharge characteristic stored in said non-volatile memory.

16. The controller of claim 14 wherein the reserve charge of said battery is estimated by subtracting said second point from said first point and comparing this result to a battery discharge characteristic stored in said non-volatile memory.

17. The controller of claim 14 wherein the reserve charge of said battery is estimated by measuring the current drawn by said load when said battery active is asserted, computing a depth of discharge from said current measurement and said duration of discharge, and storing the number of incidences of said discharges according to said duration.

18. The controller of claim 16 wherein said Reserve_Capacity is computed by examining said duration of discharge, said depth of discharge, and the number of said discharges at each discharge depth.

19. A method for measuring the reserve capacity in a battery, said method comprising the steps:
   providing a trickle charge to said battery until a first point in time;
   providing a load across said battery and measuring the voltage of said battery until the first derivative of voltage versus time falls to ½ or less of its initial value, such time denoting a second point in time, said difference in time between said second point in time and said first point in time forming a discharge time;
   comparing said measured discharge time with a known characteristic of said discharge time versus reserve charge and producing said reserve charge.

20. A method for measuring the reserve capacity in a battery, said method comprising the steps:
   providing a trickle charge to said battery until a first point in time;
   providing a load across said battery and measuring the voltage of said battery until the first derivative of said battery voltage versus time changes to ½ or less of its initial value, such time denoting a second point in time, said second point in time having a second battery voltage, the difference between said second battery voltage and said initial battery voltage forming a discharge voltage change;
   comparing said measured discharge voltage change with a known characteristic of said discharge voltage change versus reserve charge.

21. A method for estimating the reserve capacity of a battery comprising the steps:
   initializing a non-volatile variable State to TEST;
   performing a battery test on an internal battery using said measurement device as said load;
   setting said variable State to COMPLETE when finished;
   checking to see if said Status is TEST when said test is not being performed, and sending a replace battery message over a network link when said Status is found to be TEST.

22. An internet telephone comprising:
   a power supply having a mains input and a dc output;
   a rechargeable battery;
   a multiplexer having a power supply input coupled to said dc output, a battery input coupled to said rechargeable battery, and a multiplexer output coupled to a load, said multiplexer including a battery test input for connecting said battery to said multiplexer output, said multiplexer including a battery enable output for indicating when said battery input is coupled to said multiplexer output, said multiplexer connecting said battery input to said multiplexer output only when said battery test input is active and said battery is determined to be capable of operating said load;

said load including a controller having a network link, said link sending usage patterns of said internet telephone to a remote power server, said remote power server monitoring said usage patterns of a plurality of internet telephones, and sending battery test information to each said internet telephone.

23. The internet telephone of claim 22 wherein said controller receives characteristics of said battery from said power server.

24. The internet telephone of claim 22 wherein said controller receives a battery test time from said remote power server.

25. The internet telephone of claim 24 wherein said battery test time is determined by said remote power controller based on previous patterns of minimum internet telephone usage.

26. The internet telephone of claim 22 wherein said controller sends a replace battery message to said remote power controller.

27. The internet telephone of claim 22 wherein said remote power controller stores measurement data collected by said load controller.

* * * * *